(12) United States Patent
Chen

(10) Patent No.: US 12,272,643 B2
(45) Date of Patent: Apr. 8, 2025

(54) SEMICONDUCTOR DEVICE WITH IDENTIFICATION STRUCTURE, METHOD FOR MANUFACTURING AND TRACING PRODUCTION INFORMATION THEREOF

(71) Applicant: AP MEMORY TECHNOLOGY CORPORATION, Hsinchu County (TW)

(72) Inventor: Wenliang Chen, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 477 days.

(21) Appl. No.: 17/748,081

(22) Filed: May 19, 2022

(65) Prior Publication Data

US 2022/0399271 A1 Dec. 15, 2022

Related U.S. Application Data

(60) Provisional application No. 63/209,934, filed on Jun. 11, 2021.

(51) Int. Cl.
*H01L 23/525* (2006.01)
*H01L 21/768* (2006.01)
*H01L 23/528* (2006.01)
*H01L 23/532* (2006.01)

(52) U.S. Cl.
CPC .... *H01L 23/5258* (2013.01); *H01L 21/76802* (2013.01); *H01L 21/76877* (2013.01); *H01L 23/528* (2013.01); *H01L 23/53209* (2013.01)

(58) Field of Classification Search
None
See application file for complete search history.

(56) References Cited

U.S. PATENT DOCUMENTS

| 5,294,812 A | * | 3/1994 | Hashimoto | ........ | G01R 31/2884 |
| | | | | | 257/E23.179 |
| 2012/0161278 A1 | * | 6/2012 | Meyer | ................. | H01L 23/5258 |
| | | | | | 257/E23.149 |

OTHER PUBLICATIONS

Non-final Office Action and Search Report of TW family patent Application No. 111120485, issued on Feb. 24, 2023.
English translation (Brief) of the Non-final Office Action and Search Report of TW family patent Application No. 111120485, issued on Feb. 24, 2023.

* cited by examiner

*Primary Examiner* — Michelle Mandala
*Assistant Examiner* — Jordan M Klein
(74) *Attorney, Agent, or Firm* — WPAT, P.C.; Anthony King

(57) ABSTRACT

A semiconductor device with an identification structure is provided. The semiconductor device includes a substrate and a metallization structure over the substrate. The metallization structure includes an interconnection region having a plurality of metal layers and an identification region isolated from the interconnection region. The identification region has an identification structure leveled with one of the metal layer. The identification structure includes at least one exposing recess and at least one exposing fuse. A method for manufacturing a semiconductor device with an identification structure and a method for tracing a production information of a semiconductor device are also provided.

18 Claims, 9 Drawing Sheets

Lot ID: XXX123 (3bits)

Binary: 0001111011

| 512 | 256 | 128 | 64 | 32 | 16 | 8 | 4 | 2 | 1 |
|---|---|---|---|---|---|---|---|---|---|
|  |  |  | ▨ | ▨ | ▨ | ▨ |  | ▨ | ▨ |

Wafer #: 07 (2bits)

Binary: 00111

| 16 | 8 | 4 | 2 | 1 |
|---|---|---|---|---|
|  |  | ▨ | ▨ | ▨ |

X coordinate: 115 (3bits)

Binary: 0001110011

| 512 | 256 | 128 | 64 | 32 | 16 | 8 | 4 | 2 | 1 |
|---|---|---|---|---|---|---|---|---|---|
|  |  |  | ▨ | ▨ | ▨ |  |  | ▨ | ▨ |

Y coordinate: 128 (3bits)

Binary: 0010000000

| 512 | 256 | 128 | 64 | 32 | 16 | 8 | 4 | 2 | 1 |
|---|---|---|---|---|---|---|---|---|---|
|  |  | ▨ |  |  |  |  |  |  |  |

FIG. 2

SEMICONDUCTOR DEVICE WITH IDENTIFICATION STRUCTURE, METHOD FOR MANUFACTURING AND TRACING PRODUCTION INFORMATION THEREOF

PRIORITY CLAIM AND CROSS-REFERENCE

This application claims the benefit of prior-filed U.S. provisional application No. 63/209,934 filed Jun. 11, 2021, and incorporates them entirety herein.

FIELD

The present disclosure relates to a semiconductor device, the methods for manufacturing and tracing production information thereof, particularly, an identification structure formed in the semiconductor device in the present disclosure can be identified visually, which can be applied in passive components since the passive components cannot be identified in an electrical identification.

BACKGROUND

The production information of the semiconductor integrated circuit (IC) can be an identification number showing a production history or a manufacturer's number of the IC chip, and the like. In some examples, the production information of the semiconductor integrated circuit is written in the built-in memory or the external memory before the semiconductor integrated circuit starts normal operation. By this configuration, the production information stored in the memory can be read by the processor immediately after the semiconductor integrated circuit has started normal operation, whereby the processor can appropriately control the semiconductor integrated circuit.

In other examples, the production information showing a production history, manufacturer's number, or the like of an IC chip is stored in a production information reference register provided in the IC chip. The production information can be read by an external CPU and used for various purposes.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 2 illustrates a list of transforming production information in binary representation according to some embodiments of the present disclosure.

DETAILED DESCRIPTION

Figure 1A:
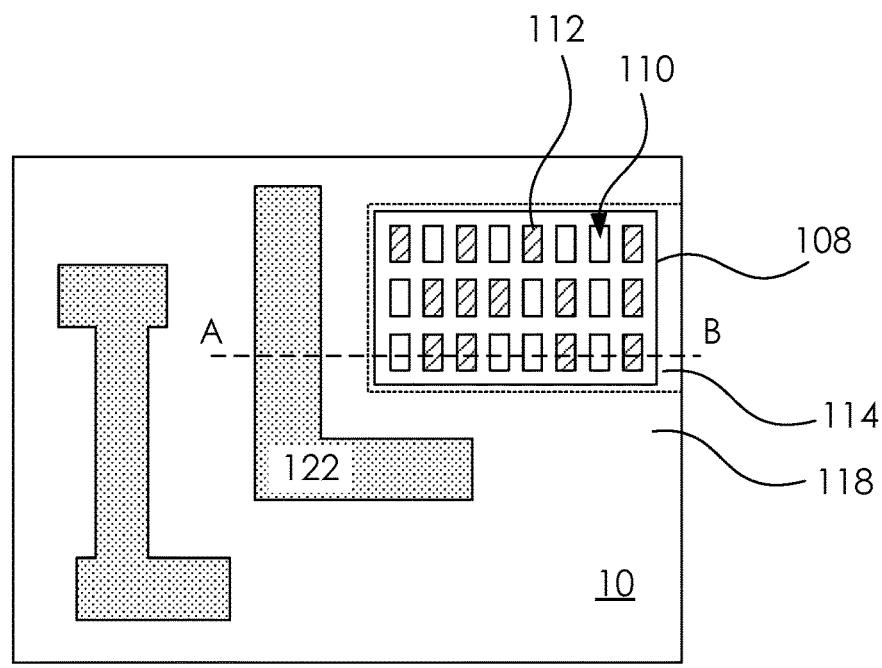
FIG. 1A illustrates a top view of a semiconductor device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

Semiconductor device recognition can be achieved by electronic identifications formed in the semiconductor device if such a semiconductor device is an active component. Active components are devices that include an analog electronic filter with the ability to amplify a signal or produce a power gain. A typical active component would be an oscillator, transistor or integrated circuit. Because active components have logic circuit (e.g., register circuit) that can be programmed to read out the component information, such as the production information, can be accessed by an electrical approach.

Compared with the active components, the abovementioned electronic identifications cannot be implemented in the passive components because the passive components cannot introduce net energy into the circuit. Passive components include two-terminal components such as resistors, capacitors, inductors, and transformers. These passive components also cannot rely on a source of power, except for what is available from the (AC) circuit they are connected to. Consequently, the passive components cannot amplify (increase the power of a signal), although they may increase a voltage or current.

Therefore, the present disclosure provides a non-electronic identification approach to recognize the semiconductor device, particularly, to recognize passive components which used to be free from being recognized. In some embodiments of the present disclosure, the non-electronic identification approach is a visual identification approach, and by using the structure features embedded in the semiconductor devices, the production information thereof can be properly recorded and be read by the visual identification approach. Accordingly, the track of the semiconductor devices, such as failure analysis tracking, can thus be traced back to the manufacturing stage, and the reasons for the failure can thus be revealed, which may greatly help in optimizing the development of the product manufacturing and the quality control.

Figure 1B:
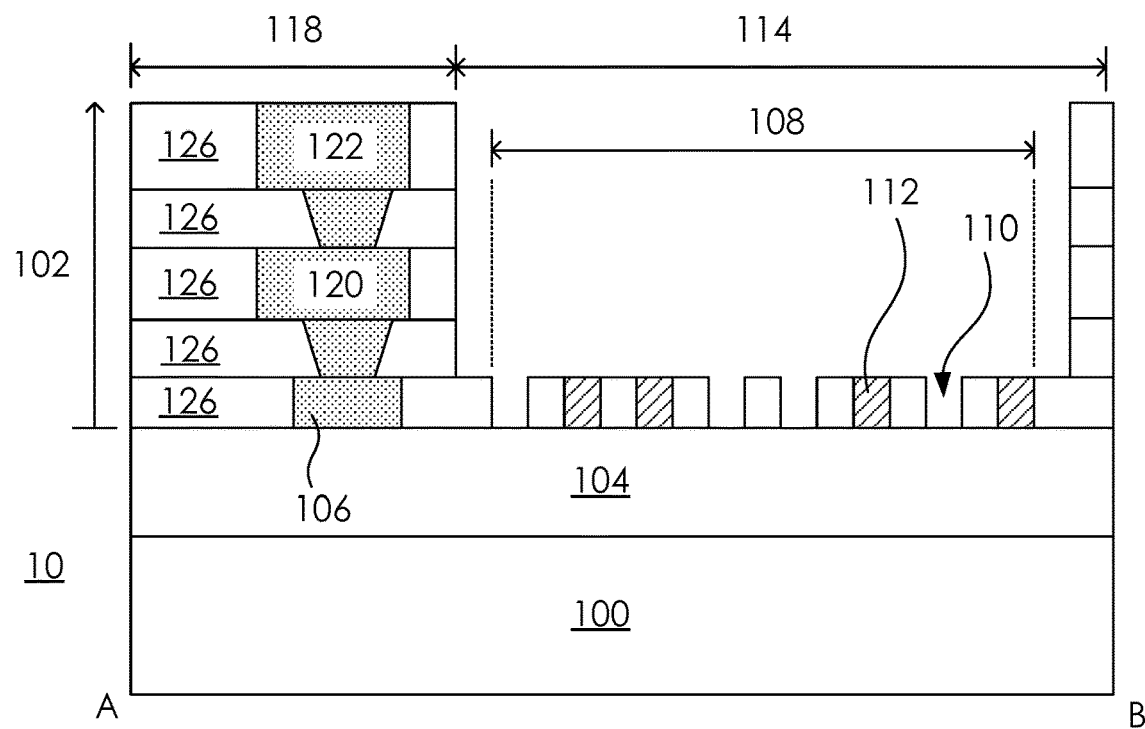
FIG. 1B illustrates a cross-sectional view of a semiconductor device according to some embodiments of the present disclosure.

In some embodiments of the present disclosure, a semiconductor device with an identification structure or identification tag is disclosed. Referring to FIGS. 1A and 1B, the semiconductor device 10 can include a substrate 100 and a metallization structure 102 over the substrate 100. The substrate 100 can be a semiconductor substrate which includes semiconductor materials such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. In other embodiments, the substrate 100 is made of glass. In the embodiments that the semiconductor device is a passive component, the substrate 100 can be free from having an electrical structure therein.

The metallization structure 102 is formed over a top surface of the substrate 100. In some embodiments, a dielectric layer 104 is between the metallization structure 102 and the substrate 100. The dielectric layer 104 can be a portion of a middle-of-line (MOL/MEOL) structure, which is the portion that formed prior to the forming of a first metal layer (M1) of the metallization structure 102. The metallization structure 102 includes an interconnection region 118 and an identification region 114 isolated from the interconnection region 118. The interconnection region 118 of the metallization structure 102 can include at least a metal layer, for example, a plurality of metal layers can be stacked with a plurality of second dielectric layers in the interconnection region 118, and the plurality of metal layers can be electrically connected by a plurality of conductive vias. In some embodiments, the metallization structure 102 can be a portion of a back-end-of-line (BEOL) structure. In some embodiments, some structures of the passive component can be formed within the MEOL structure.

Referring to FIG. 1B, which is a cross-sectional view of the semiconductor device along the line AB labeled in FIG. 1A, in some embodiments, the metallization structure 102 includes a metal layer 106 and an identification structure 108 leveled with the metal layer 106. The metal layer 106 is made of conductive materials such as Al or Cu. The metal layer 106 is a portion of an electrical circuit, thus the metal layer 106 is in contact with a conductive via (not shown in the figure) at a top surface of the metal structure of the metal layer 106. In contrast, within the identification region 114, the identification structure 108 therein is configured to perform the purpose of recognition, and therefore the identification structure 108 is electrically isolated from the metal layer 106 and disconnected therefrom. In some embodiments, the identification structure 108 is entirely disconnected from any conductive structures in the semiconductor device.

The identification structure 108 can include at least one exposing recess and at least one exposing fuse for visual identification. In some embodiments, as illustrated in FIG. 1A, the identification structure 108 can include a plurality of recesses 110 arranged in at least one row from a top view perspective and a plurality of fuses 112 distributed in the plurality of recesses 110. These fuses 112 are distributed in at least a portion amount of the recesses 110. In other words, in some embodiments of the present disclosure, the identification structure 108 is an array or one or more rows be arranged and composed of empty recesses 110 and recesses 110 that are filled by fuses 112. The fuse 112 filled in the recess 110 can be a conductive metal line or wire suspended in a surrounding dielectric material, and the profile of each of the recesses 110 from a top view perspective is substantially corresponding to the profile of the fuse 112. Each of a plurality of fuses 112 is electrically disconnected from the metal layer 106. Furthermore, in some embodiments, the fuses 112 can be blown by using laser beam or laser energy to melt and vaporize a portion of the overlying dielectric material (if any) thereover to form the recesses 110, which generally can be used as a highly resistive cut for an electrical purpose, whereas the present disclosure uses these recesses 110 to be compared with the fuses 112 free from being ruptured by the laser for a visual identification purpose. The details of the forming of the recesses and the distribution of the recesses 110 and the fuses 112 will be discussed in later paragraphs.

Since the fuses 112 can be formed concurrently with the metal layer, the material of the fuses 112 is identical to the material of the metal layer (i.e., Al or Cu). The recess 110 without having the fuse 112 therein can be configured to perform as a "first code" or "first digit", whereas the recess 110 having the fuse 112 therein can be configured to perform as a "second code" or "second digit", which means the identification structure 108 in some embodiments of the present disclosure is a binary representation system.

Since the identification structure 108 in some embodiments of the present disclosure is electrically isolated from the metal layer 106 and disconnected therefrom, the function of the identification structure 108 has to be implemented by using a visual approach instead of an electrical approach. According to the schematic, i.e., FIG. 1A, the brightness of the recess 110 without having the fuse 112 and the brightness of the recess 110 having the fuse 112 are visually distinguishable. For example, in the circumstance that the recess 110 is filled by the fuse 112, such recess 110 (with fuse 112) is bright (marked in slant lines in the figure) and would be much brighter than the recess 110 which is not filled by the fuse 112. Meanwhile, those recesses 110 that are not filled by the fuse 112 would be categorized as dark ones, and so these recess 110 can be divided into bright ones and dark ones, depending on whether the recess 110 is filled by a metal material, such as the fuse 112.

By using these bright and dark patterns, the identification structure 108 can record the production information in binary representation. In some embodiments, the fuses 112 can be arranged (or be programmed) to present the production information of the semiconductor device. For example, the recess 110 without having the fuse 112 therein (i.e., the fuse 112 is not arranged to occupy the recess 110) can be configured to regard as the digit "1", whereas the recess 110 having the fuse 112 therein (i.e., the fuse 112 is arranged to occupy the recess 110) can be configured to regard as the digit "0". Accordingly, the visual differences (i.e., the brightness contrast) between the recesses 110 with and without the fuse 112, are thus used as binary codes and can further be translated as different letters, digits, or other characters that are represented by a bit string of the same length.

In some embodiments, the identification structure 108 can include tens of recesses 110 arranged in one or more rows. For instance, the identification structure 108 can include 40 recesses 110 for illustrating the production information of the semiconductor device. These recesses 110 can be physically arranged in an array that includes several rows. The physical arrangement of the recesses 110 is for cooperating of the structure of the semiconductor device, that is, the identification region 114 is usually located at a peripheral region of the semiconductor device and the dielectric layer(s) of the metallization structure 102 in the identification region 114 can include a rectangular opening window to expose the identification structure 108. The rectangular opening window can have a cross-sectional area of tens of micrometers in length and tens of micrometers in wide, for example, about 70 μm×about 20 μm.

In some embodiments, the production information of the semiconductor device, e.g., a semiconductor die, may correspond to the information that where the semiconductor die was before it diced from the wafer. Such information is useful in tracing back the manufacturing condition of the wafer if the semiconductor die is failed in testing or feed backing by the customer. In those embodiments, the identification structure 108 may provide the production serial number, particularly, the production information regarding the Lot number of the wafer and the coordinate of the semiconductor die located in the wafer.

Referring to FIG. 2, in the embodiments that the identification structure 108 provides the production information as abovementioned, the Lot number (i.e., the Lot ID) of the wafer may include the number of the Lot and the number of the wafer, and the coordinate of the semiconductor die may include the X and Y coordinates. In the example shown in FIG. 2, the number of the Lot can be a piece of 3-bits information, which needs 10 recesses 110 and some necessary fuses 112 to record this information in binary representation. Since each Lot of the wafer generally includes about 25 wafers, the number of the wafer can thus be a piece of 2-bits information, which needs 5 recesses 110 and some necessary fuses 112 to record this information in binary representation. Each of the X and Y coordinates can be a piece of 3-bits information, which needs a total of 20 recesses 110 and some necessary fuses 112 to record the coordinates in binary representation. Accordingly, in order to record the production information of the semiconductor device, in the abovementioned example, a total of 35 recesses 110 and some necessary fuses 112 are needed. In some embodiments, a total of 40 or more recesses 110 and some necessary fuses 112 are used because 5 or more addition recesses 110 are prepared for reserved bits. The reserved bits can be used to record the test result, for instance, a simple result that whether the semiconductor die is a good die or a bad die. In some embodiments, a number of the plurality of recesses 110 is in a range from about 20 to about 50. Generally, the more information recorded in the identification structure 108, the more recesses 110 are needed to be formed within the rectangular opening window, which means more area is needed to be occupied by the identification structure 108 in the metallization structure 102.

In some embodiments, the identification structure 108 can be used to record the production serial number of the semiconductor device solely. In other embodiments, the identification structure 108 can further be used to record the test result of the semiconductor device, which means the identification structure 108 can be formed after the test to provide more specific performance information for each semiconductor device. For example, the semiconductor devices such as memory dies can be tested and distinguished into different grades depending on their performances. These graded semiconductor devices can be used for different electrical products for different usages, such as for general applications or overclocking purposes. By using the identification structure 108, the test results (e.g., the die grading) of these semiconductor devices can be visually recognized easily.

Further in some embodiments, the production information can be very detailed. For instance, the wafer fabrication machine(s) that have been used in the manufacturing process of the semiconductor device, the date of manufacture, the date of testing, the coordinates of the semiconductor device in the wafer, etc., can be directly traced according to the identification structure 108.

The identification structure 108 can provide a huge benefit in FA (failure analysis) tracking. The failure analysis can include the failure location under wafer, wafer map correlation, WAT (wafer acceptance test) trend, etc. For instance, in some application scenarios of the semiconductor industry, a wafer can be sold by an upstream manufacturer to a downstream manufacturer, which the wafer is already tested and there could have several not good dies be labeled to the downstream manufacturer. If the semiconductor dies are passive components, conventionally, they cannot be traced once they are diced from the wafer, and therefore the downstream manufacturer may misuse the not good dies in the products while it is not possible to figure out the use of the not good dies is happened because of the misusage of the downstream manufacturer or the incorrect shipment of the upstream manufacturer. However, according to the identification structure 108 formed on each dies, even though these dies are passive components that cannot be electrically recognized, these dies still can be visually recognized. Thus, it is possible to figure out whether the fabrication process has a specific problem (e.g., due to the bad parameters of the wafer fabrication machine(s)), whether the good die test implemented by the upstream manufacturer is correct, and whether the downstream manufacturer has correctly selected the good dies after dicing the wafer.

Moreover, as previously mentioned, the passive components are adequate in using the visual identification approach since the electrical approach cannot be performed in the passive components. Nevertheless, the visual identification approach can still be applied to the active components as an alternative scheme in product tracing thereof. For example, the register circuit of an active component is failed and thus could not be read out correctly, and the aforementioned visual identification approach can thus provide a backup option in product tracing.

In some embodiments, the identification structure 108 is leveled with the first metal layer 106 of the metallization structure 102. The a thickness of the one of the plurality of metal layer (e.g., the first metal layer 106) is identical to a thickness of the fuses 112, and a width of each fuse 112 is substantially identical to a diameter of a spot size of a laser beam for rupturing the fuses 112. Therefore the fuses 112 can be selected to be removed by laser to form the recesses 110 in writing the production information. In some embodiments, the identification structure 108 is leveled with the thinnest metal layer of the metallization structure 102. The vertical location of the identification structure 108 is corresponding to the manufacturing of the identification structure 108, which will be disclosed in later paragraphs.

Figure 3A:
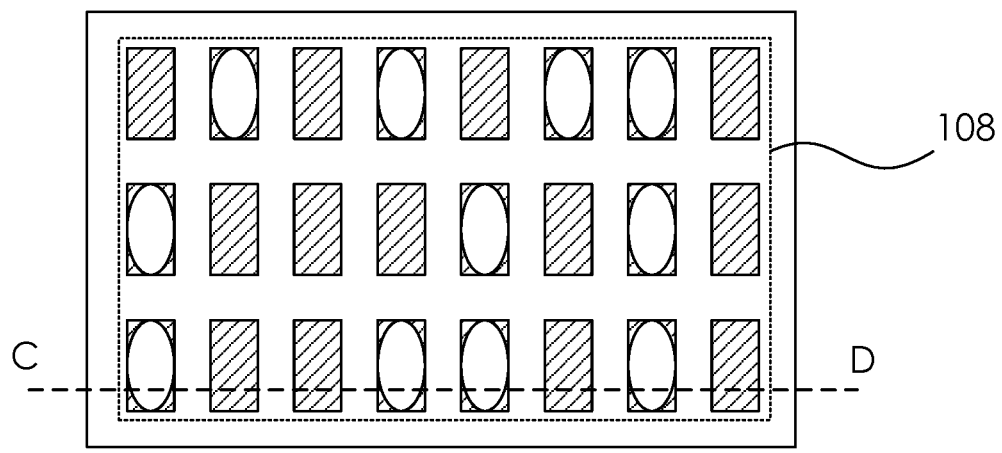
FIG. 3A illustrates a top view of an identification structure according to some embodiments of the present disclosure.
Figure 3B:
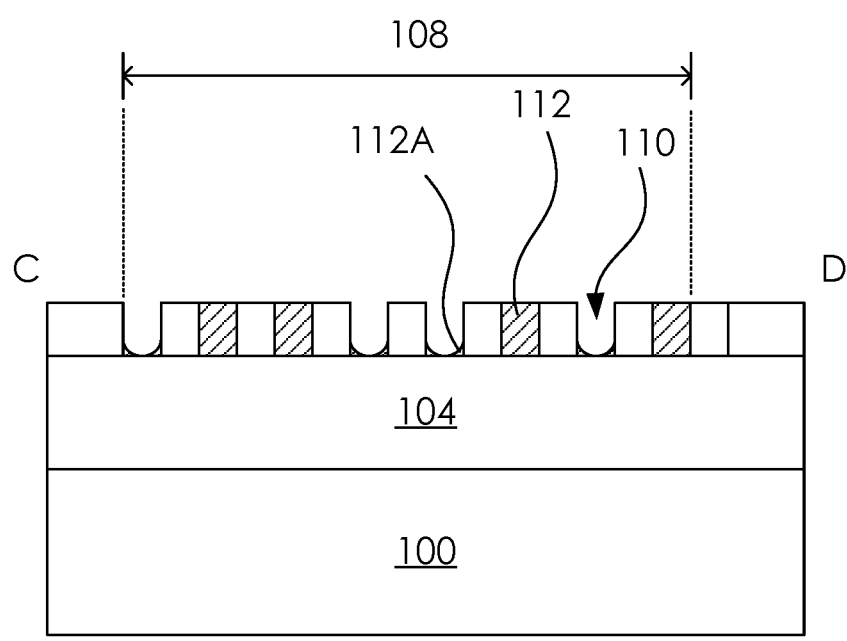
FIG. 3B illustrates a cross-sectional view of an identification structure according to some embodiments of the present disclosure.

In order to visually distinguish the recesses 110 with and without the fuses 112, the fuses 112 are removed from a portion amount of the plurality of recesses 110 by laser. In some embodiments, it is possible that the fuses 112 are not entirely removed from the recesses 110. For example, as shown in FIGS. 3A and 3B, while FIG. 3B is a cross-sectional view of the identification structure along the line CD labeled in FIG. 3A, after the fuse 112 is cleaned by laser (which can be called ruptured, trimmed or cut by laser), some residual might be left in the recess 110, and so that the recess 110 can be covered by a residual metal 112A at a corner portion of the recess 110. In other words, the fuses 112 can be partially cleaned instead of cleaned entirely. In the circumstance of the cleaned partially, the fuse 112 cut by the laser may have a substantial dishing profile at the top surface thereof. That is, these recesses 110 are free from filling by the fuses 112 but a bottom of each of these recesses 110 is covered by a metal having a dishing profile at a top surface thereof. Even though the recess 110 is literally not entirely free from having these damaged fuses or metal particles therein, these residual metals are not visually as bright as the intact fuses 112, thus the recesses 110 with and without the intact fuses 112, are still visually distinguishable through a microscope or naked eyes.

Figure 4:
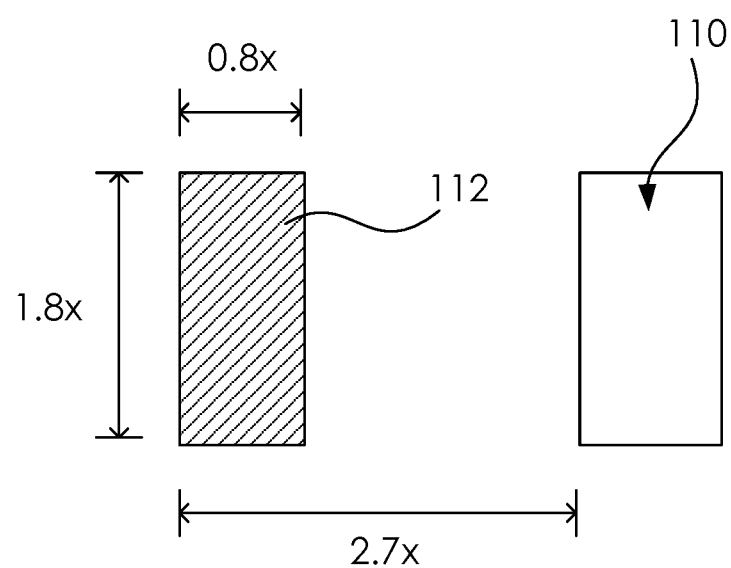
FIG. 4 illustrates a top view of adjacent recesses and a fuse filled in a recess according to some embodiments of the present disclosure.

Referring to FIG. 4, in some embodiments, each of the recesses 110 and the fuses 112 therein can have a rectangular profile from a top view perspective. In some embodiments, the pitch of the adjacent recesses 110 is about 2.7x (x is a constant), whereas the width of each of the recesses 110 is about 0.8x. In some embodiments, the length of each of the recesses 110 is about 1.8x. The pitch and the aspect ratio do not strictly limited, but each of the recesses 110 and the fuses 112 therein should be visually distinguishable and the fuses 112 can be cut by laser. Likewise, the profile of the recesses 110 and the fuses 112 therein is not limited to a rectangle as in the example above, other shapes of profiles do not depart from the scope of the present disclosure.

In some embodiments, the formation of the identification structure 108 is accomplished after the stage of wafer out in the semiconductor manufacturing process. To be more detailed, the formation of the identification structure 108 can be separated into two different stages, wherein the first stage is to form the recesses 110 and to fill the fuses 112 in each of the recesses 110. Thus, each of the recesses 110 is filled with metal (i.e., the fuse 112) and the arranged row(s) composed of the recesses 110 should be entirely bright at each point visually. Some of the fuses 112 will be ruptured, trimmed or cut by laser in a laser programming operation to program the recesses 110 thus formed and the remained fuses 112 into an informational structure.

Figure 5A:
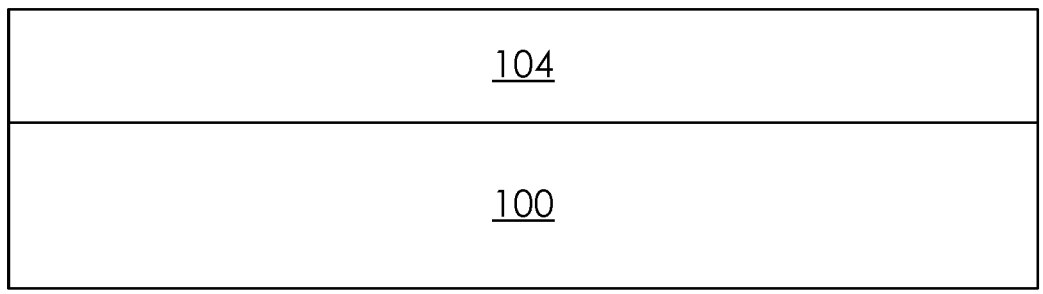
FIGS. 5A to 5D illustrate cross-sectional views of forming a semiconductor device with an identification structure according to some embodiments of the present disclosure.
Figure 5B:
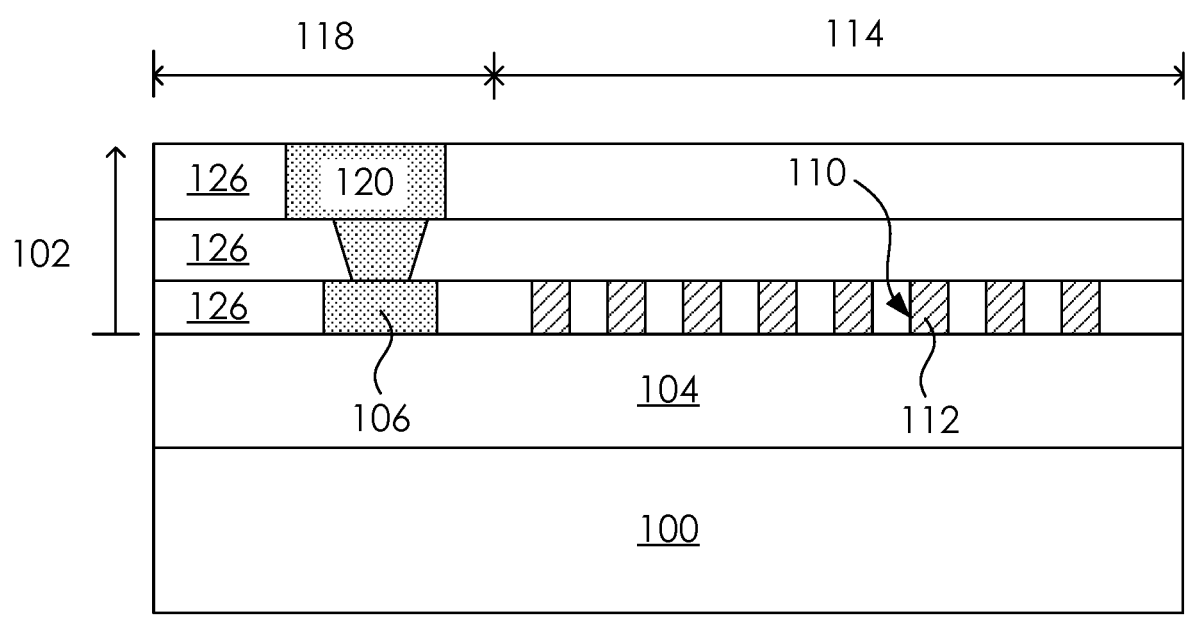
Figure 5C:
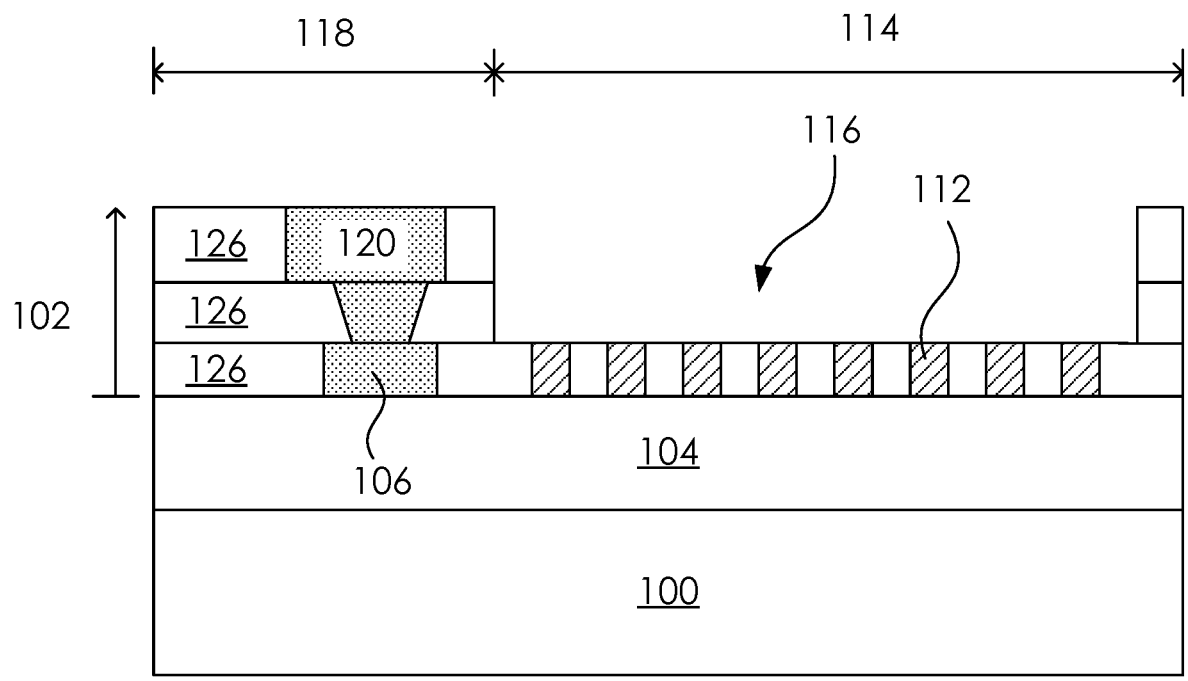

In manufacturing the semiconductor device with the identification structure 108 previously shown in FIG. 1B, may refer to FIGS. 5A to 5C. Referring to FIG. 5A, in some embodiments, a substrate 100 is received firstly, wherein the substrate is usually a semiconductor wafer that is used to form a plurality of semiconductor devices thereon, and the identification structure 108 is thus formed at the wafer-level instead of being formed after the dicing operation. In some embodiments, prior to forming the metallization structure 102 over the substrate 100, a dielectric layer 104 can be formed over the substrate 100, and therefore a later-formed metallization structure 102 is formed over the dielectric layer 104.

Next, referring to FIG. 5B, the metallization structure 102 can be formed over the substrate 100. The metallization structure 102 includes an identification region 114 reserved for forming the identification structure 108, whereas one or more metal layers are formed within an interconnection region 118 of the metallization structure 102. One or more ILD (interlayer dielectric) layers 126 can be used to cover and/or surround the metal layer(s) in the metallization structure 102. In some embodiments, the patterns of one of the metal layer e.g., the metal layer 106) and the fuses 112 can be formed concurrently, wherein the metal layer is formed for electrical connection while the fuses 112 are entirely isolated from any conductive structures. The profile of the material (e.g., the dielectric material) surrounding each of the fuses 112 can be seen the recess 110, which is yet to be exposed at this stage. In some embodiments, the metal layer 106 is the thinnest metal layer in the metallization structure 102. The selection of the vertical position of the fuse 112 is related to the recipe of the laser for cutting the fuse 112. That is, in some embodiments, the fuses 112 are leveled with the thinnest metal layer in the metallization structure 102, usually is the first metal layer (M1), because the cleaning operation, or called trimming or cutting operation, is much easier to be implemented to the first metal layer in the metallization structure 102.

In the circumstances that the fuses 112 are thick, for example, the fuses 112 are formed concurrently with the second metal layer or other upper metal layers which are usually thicker than the first metal layer, the thicknesses of the fuses 112 may be hard to be cleaned. The thickness of the metal layer is substantially identical to the thickness of the fuse 112 leveled therewith. On the other hand, once the power of the laser is enhanced to clean these thick fuses 112, not only the enhanced laser may damage the peripheral structures, but the particles of the cleaned fuse 112 may be sputtered to the peripheral regions and make unwanted pollution. As previously mentioned, in some embodiments, some structures of the passive component can be formed within the MEOL structure, and the enhanced laser might damage the structures of the passive component if such structure is formed below the identification structure 108. Therefore, to ensure the fuses 112 are as thin as the first metal layer is a preferred option based on the current practice, but the scope of the present disclosure do not limit by these real practice experiences.

Figure 5D:
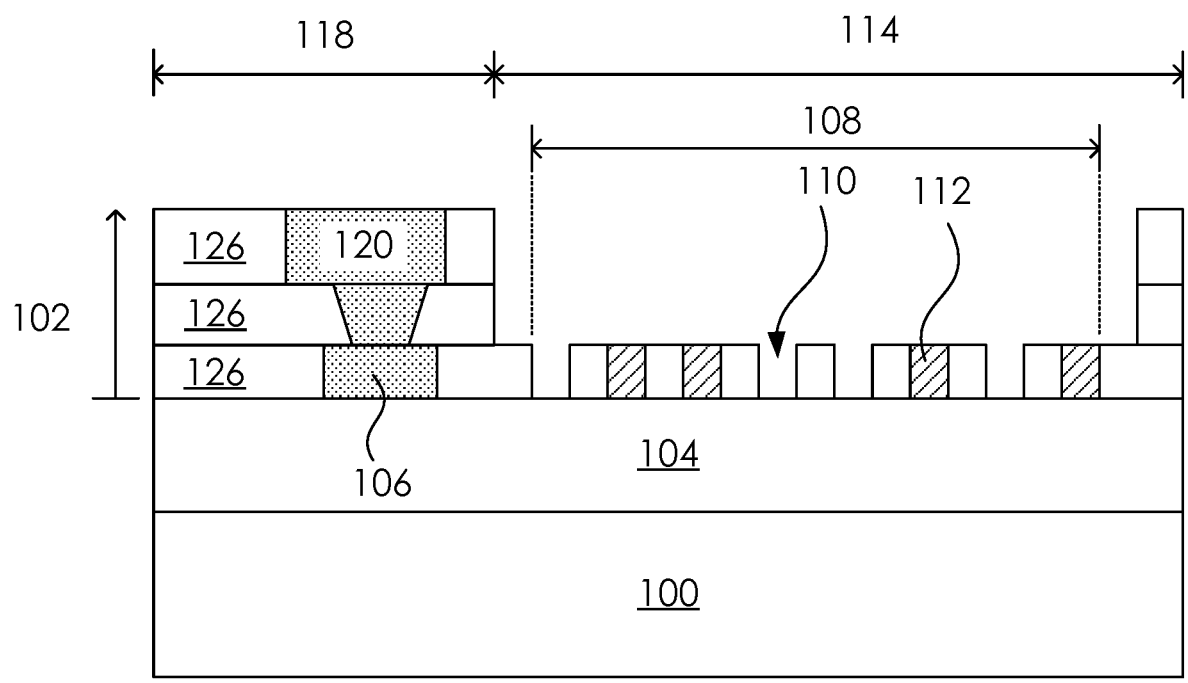

Referring to FIGS. 5C and 5D, in some embodiments, a portion amount of the fuses 112 are removed from the plurality of recesses 110. Prior to removing the portion amount of the fuses 112, since the fuses 112 are covered by a thick dielectric material (i.e., several layers 126), therefore an opening window 116 can be formed at the ILD layers 126 in the identification region 114 for exposing the fuses 112 in advance. In some embodiments, the forming of the opening window 116 can be achieved by a photomask and an etching operation. The removal of the fuses 112, called cleaning, trimming, or cutting, is based on a laser file provided by the manufacturer of the semiconductor device. The laser file is an instruction to indicate which fuses 112 should be removed from the recesses 110 to program the array of the recesses 110 into a visualized label. Generally, the removal operation can be implemented under the laser repair technique. Laser repair is widely used in the semiconductor industry, such as in the manufacturing of memory. Such technique can use a laser beam to cut circuit fuses to decode the circuits so that the defective memory cells can be replaced by backup circuits to achieve the process yield improvement target. In the present disclosure, based on the current laser repair technique, it would be much easier to use the well-tuned laser recipe to cut the fuses 112 in the recesses 110 since the target of the laser is almost identical and should be compatible. However, the thicknesses of the metal layers in the metallization structure 102 could be significantly different between different semiconductor devices due to different design rules, and therefore the laser power and other corresponded parameters in removing a portion amount of the fuses 112 from the plurality of recesses 110 still should be readjusted case by case.

The laser file provided by the manufacturer of the semiconductor device can include the product information of the semiconductor device. Since each of the semiconductor devices, e.g., semiconductor dies, should be located at a specific coordinate in a specific wafer, and therefore each of the semiconductor devices should have a unique identification structure that is different from each other. In other words, the identification structure 108 in the present disclosure is customized for each semiconductor device, and such identification structure 108 is not a single trademark that is usually patterned at a corner of the semiconductor device.

The laser file is used to provide the production information. As aforementioned, the production information can include the information that can be used to trace back the manufacture process, including the wafer fabrication machine(s) that have been used in the manufacturing process of the semiconductor device, the date of manufacture, the date of testing, the coordinates of the semiconductor device in the wafer, etc. Furthermore, if the semiconductor device is tested, the laser file can further include the test result to add more information into the identification structure 108.

By cleaning a portion amount of the fuses 112 from the plurality of recesses 110, the arranged row(s) composed of the recesses 110 in the identification structure 108 can thus include a plurality of dark units (i.e., the recesses 110 without fuses 112 therein) and a plurality of bright units (i.e., the recesses 110 with fuses 112 therein), and these visually distinguishable units can be used as digits 0 and 1 (or 1 and 0) in binary representation.

Figure 6A:
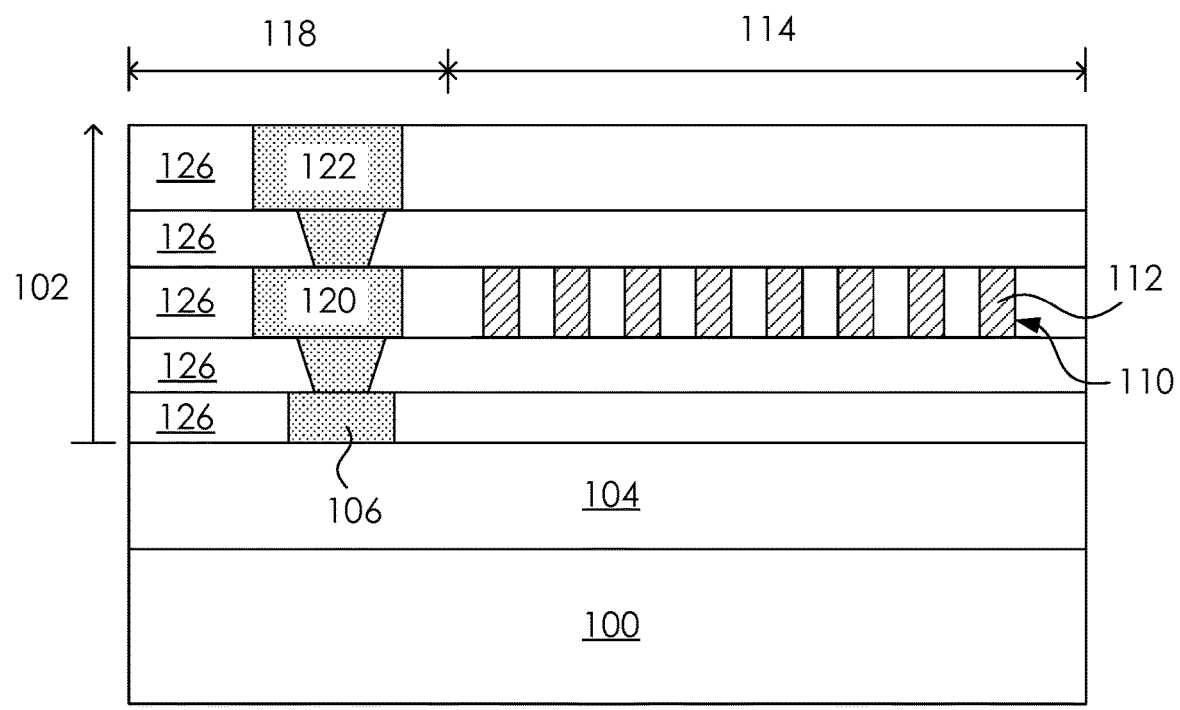
FIGS. 6A to 6C illustrate cross-sectional views of forming a semiconductor device with an identification structure according to some embodiments of the present disclosure.
Figure 6B:
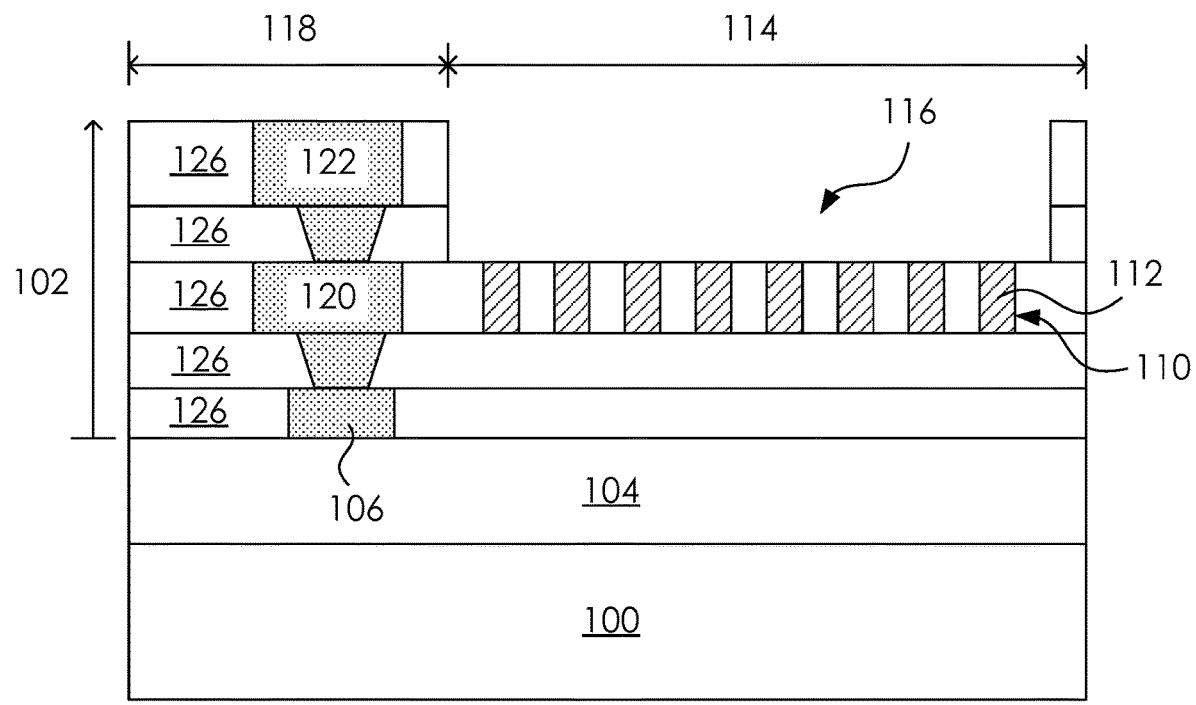
Figure 6C:
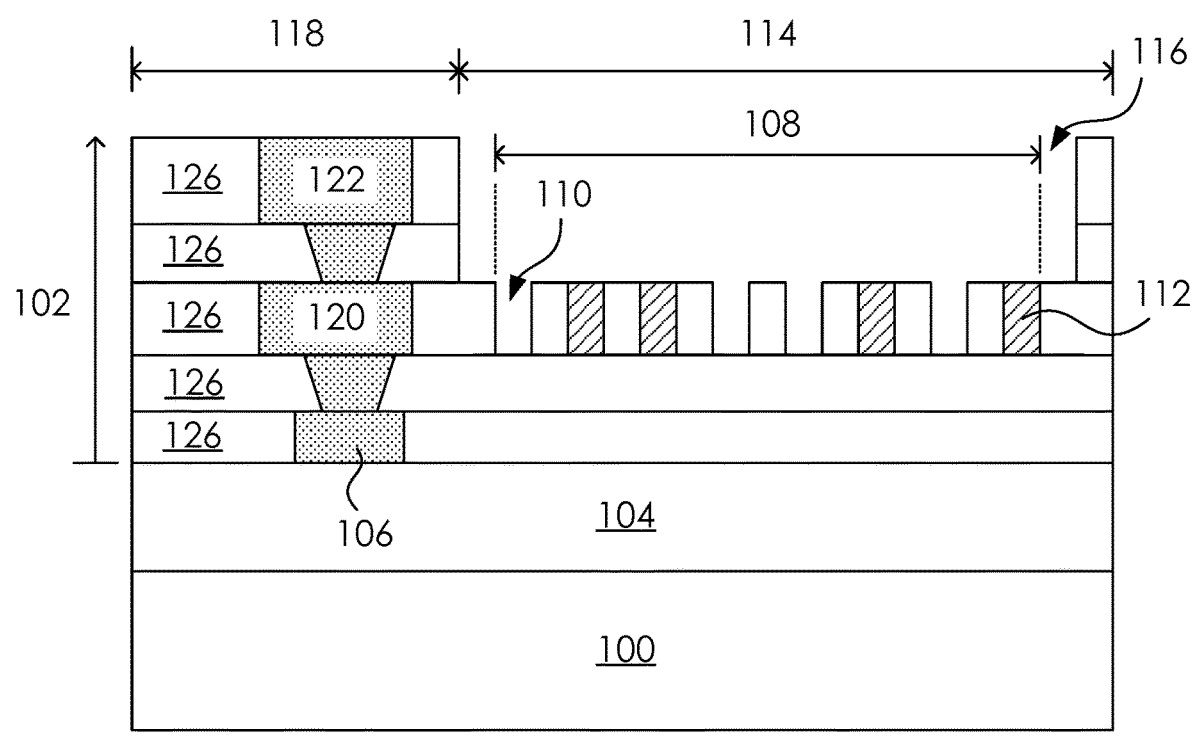

Referring to FIGS. 6A to 6C, in some embodiments, the identification structure 108 is leveled with a metal layer over the first metal layer of the metallization structure 102. In other words, in some embodiments, the identification structure 108 is not formed in the thinnest metal layer of the metallization structure 102. No matter the fuses 112 for the identification structure 108 is leveled with the (first) metal layer (M1) 106 as shown in FIG. 5B, a second metal layer (M2) 120 as shown in FIG. 6A or a third metal layer (M3) 122, the opening window 116 can be formed at the ILD layers 126 in the identification region 114 for a necessary depth to expose the fuses 112 for the identification structure 108, as illustrated in FIG. 6B prior to removing the portion amount of the fuses 112.

Figure 7A:
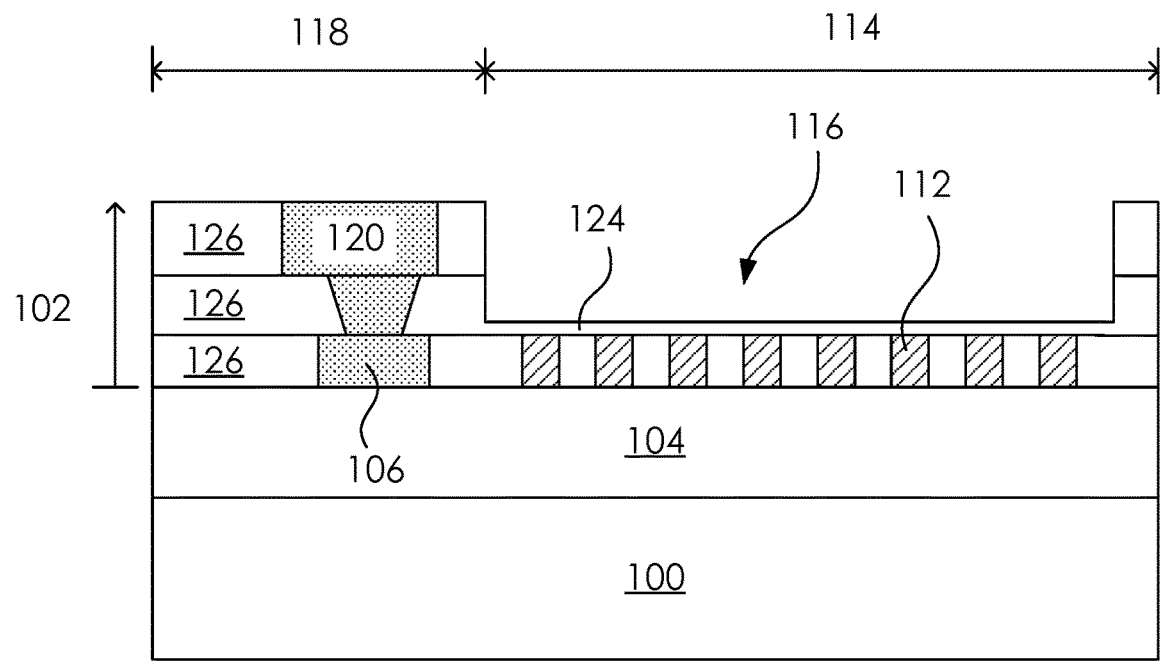
FIGS. 7A and 7B illustrate cross-sectional views of forming a semiconductor device with an identification structure according to some embodiments of the present disclosure.
Figure 7B:
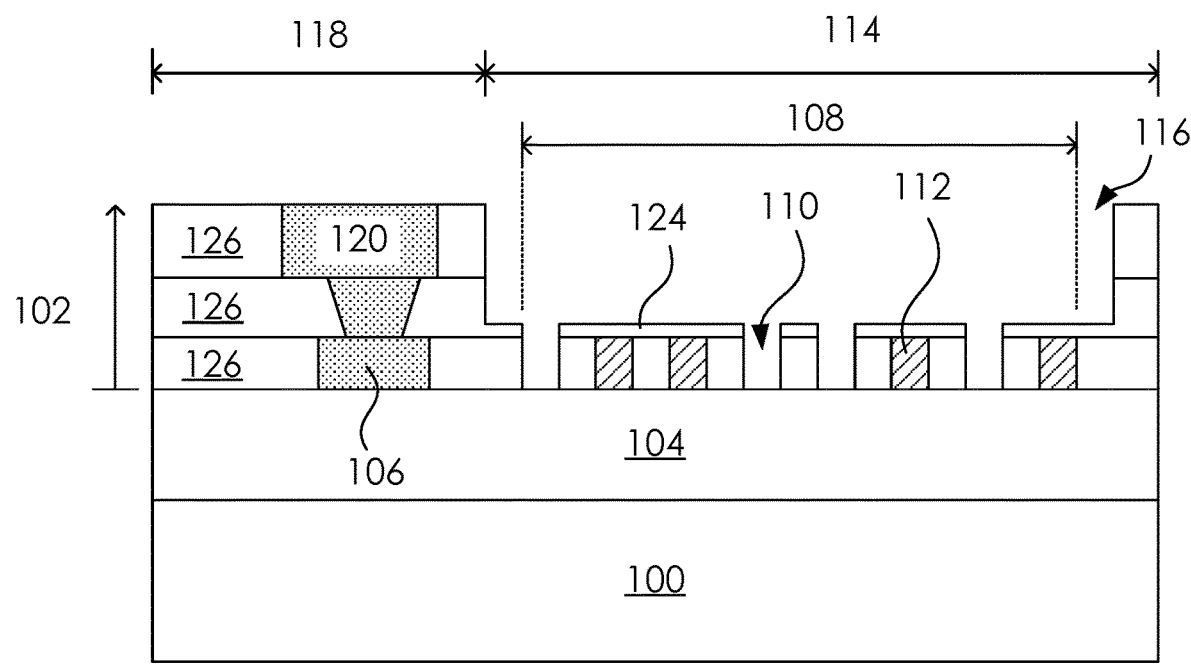

Referring to FIGS. 7A and 7B, in some embodiments, the dielectric material over the identification structure 108 does not be entirely removed in forming the opening window 116. That is, a thin dielectric layer 124 can be remained over the fuses 112 for the identification structure 108, wherein the thickness of the thin dielectric layer 124 is less than the thickness of each of other dielectric layers (i.e., layers 126) in the interconnection region 118 of the metallization structure 102. By using laser to remove a portion amount of the fuses 112, the thin dielectric layer 124 can thus include a plurality of openings exposing the recesses 110 free from filling by the fuses 112. On the other hand, a top surface of each of the plurality of fuses 112 is in contact with the thin dielectric layer 124.

In some embodiments, the material of the thin dielectric layer 124 includes aluminum oxide ($AlO_x$), and such material may have a benefit in focusing the laser energy in cutting the fuses 112. Furthermore, the thin dielectric layer 124 remained over the fuses 112 and in contact thereto in the product can be used to prevent the fuses 112 in the identification structure 108 from oxidation; even though these fuses 112 are configured for visual identification instead of electrical connection purpose, however, the metal without oxidation may provide a better brightness contrast compared with the recesses 110 without fuses 112 therein.

After a portion amount of the fuses 112 are removed from the plurality of recesses 110, the wafer having the semiconductor devices can further proceed with the subsequent production operations, such as bumping, packaging, dicing, testing (the testing operation can be implemented prior to the laser marking operation, i.e., removing the fuses), shipping, etc., depending on the ordinary manufacturing process of the semiconductor devices. In some embodiments, the opening window 116 for exposing the identification structure 108 could be covered or at least partially surrounded by a molding material during the packaging process. Accordingly, once the semiconductor device is send back to the manufacturer, before the manufacturer uses the identification structure 108 to trace the production information of a semiconductor device, the manufacturer can firstly remove the molding material over the identification structure 108 prior to identifying the identification structure. Subsequently, the manufacturer can identify the distribution of the plurality of fuses 112 to obtain a distribution information, and then to obtain the production information of the semiconductor device by using the distribution information. In some embodiments of the present disclosure, the production information of the semiconductor device is thus obtained through the brightness contrast between the at least one exposing recess and the at least one exposing fuse in the identification structure, for instance, through the brightness contrast between the plurality of recesses 110 and the plurality of fuses 112 in the identification structure 108.

To be more detailed, the abovementioned identification structure 108 can make the semiconductor devices, particularly the passive components, have unique IDs for their traceability. Therefore, in the circumstances that the feedback is received from the customers, it is feasible to trace the production information of the semiconductor devices according to the identification structure 108. Generally, once the semiconductor device in question is received, a visual inspection can be implemented by checking the identification structure 108 through a microscope or naked eyes. The mixture of bright and dark units in the identification structure 108 can be decoded into the production information to recognize the production parameters easily, quickly, and accurately. Thereby the manufacturer of the semiconductor device can implement a failure analysis operation and thus improve and optimize the product quality and the yield.

Briefly, according to the abovementioned embodiments, an identification structure for recognizing a semiconductor device through a visual approach is disclosed. Particularly, the identification structure can overcome the problem that the production information of the passive components cannot be traced back due to the lack of register circuits. By using the fuses, recesses, and laser repair technique, the identification structures can be formed concurrently with the ordinary BEOL structure and can be easily programmed according to the unique production information of each of the semiconductor devices. As a result, the failure analysis of each of the semiconductor devices can be traced back to the production information in very detail, and the after-sales service and the technical support of the semiconductor devices can be completed and fully upgraded.

In one exemplary aspect, a semiconductor device is provided. The semiconductor device includes a substrate and a metallization structure over the substrate. The metallization structure includes an interconnection region having a plurality of metal layers and an identification region isolated from the interconnection region. The identification region has an identification structure leveled with one of the plurality of metal layer. The identification structure includes at least one exposing recess and at least one exposing fuse.

In another exemplary aspect, a method for manufacturing a semiconductor device with an identification structure is provided. The method includes the following operations. A substrate is received. A metallization structure is formed over the substrate. The metallization structure includes an identification region, the identification region includes a plurality of recesses arranged in at least one row, and each of the plurality of recesses is filled by a fuse. A portion amount of the fuses are removed from the plurality of recesses to form the identification structure.

In yet another exemplary aspect, a method for tracing a production information of a semiconductor device is provided. The method includes the following operations. The distribution of the at least one exposing recess and the at least one exposing fuse is identified to obtain a distribution information. The production information of the semiconductor device is obtained by using the distribution information.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate; and
a metallization structure over the substrate, the metallization structure comprises:
an interconnection region having a plurality of metal layers; and
an identification region isolated from the interconnection region, wherein the identification region has an identification structure leveled with one of the plurality of metal layers, wherein the identification structure comprises a plurality of recesses arranged in at least one row from a top view perspective and a plurality of fuses, and the plurality of fuses comprises:
a first group of fuses in a first portion amount of the plurality of recesses; and
a second group of fuses in a second portion amount of the plurality of recesses, wherein a height of each of the second group of fuses is less than a height of each of the first group of fuses.

2. The semiconductor device of claim 1, wherein a distribution of the plurality of fuses is configured by a laser beam to present a production information of the semiconductor device, and each of the plurality of fuses is electrically disconnected from the plurality of metal layers.

3. The semiconductor device of claim 2, wherein the production information corresponds to a lot number of a wafer, a number of the wafer, a coordinate of the semiconductor device in the wafer, a manufacturing date, a number of a fabrication machine, a test date, or a test result.

4. The semiconductor device of claim 1, wherein the semiconductor device is a passive component.

5. The semiconductor device of claim 1, wherein a thickness of the one of the plurality of metal layer is identical to the height of each of the first group of fuses.

6. The semiconductor device of claim 1, wherein the metallization structure further comprises a dielectric layer having an opening window exposing the identification structure.

7. The semiconductor device of claim 1, wherein the metallization structure further comprises a thin dielectric layer covering the identification structure, wherein a thickness of the thin dielectric layer is less than a thickness of each of a plurality of dielectric layers in the interconnection region of the metallization structure.

8. The semiconductor device of claim 7, wherein the thin dielectric layer comprises a plurality of openings exposing the recesses free from filling by the first group of fuses.

9. The semiconductor device of claim 7, wherein a top surface of each of the first group of fuses is in contact with the thin dielectric layer.

10. The semiconductor device of claim 1, wherein the second portion amount of the plurality of recesses are filled by the second group of fuses.

11. The semiconductor device of claim 1, wherein a number of the plurality of recesses is in a range from about 20 to about 50.

12. A method for manufacturing a semiconductor device with an identification structure, the method comprising:
receiving a substrate;
forming a metallization structure over the substrate, wherein the metallization structure comprises an identification region, the identification region comprises a plurality of recesses arranged in at least one row, and each of the plurality of recesses is filled by a fuse; and
removing a portion amount of the fuses from the plurality of recesses to form the identification structure, wherein a height of each of the fuses being removed in the portion amount of fuses is less than a height of each of the fuses not being removed.

13. The method of claim 12, wherein the step of removing the portion amount of the fuses from the plurality of recesses to form the identification structure comprises:
using laser beam to remove the portion amount of the fuses.

14. The method of claim 12, wherein the fuses are concurrently formed with a metal layer in the metallization structure.

15. The method of claim 14, wherein the metal layer is the first metal layer (M1) in the metallization structure.

16. The method of claim 12, wherein forming the metallization structure over the substrate comprises:
forming a metal layer over the substrate and concurrently filling the plurality of fuses in the plurality of recesses prior to removing the portion amount of the fuses from the plurality of recesses.

17. The method of claim 16, further comprising:
forming at least a dielectric layer over the identification structure; and
forming an opening window at the dielectric layer to expose the plurality of recesses.

18. The method of claim 12, further comprising:
forming at least a dielectric layer over the identification structure; and
thinning down the dielectric layer in the identification region to form a thin dielectric layer over the identification structure, wherein a thickness of the thin dielectric layer is less than a thickness of each of a plurality of dielectric layers in an interconnection region of the metallization structure.

* * * * *